United States Patent
Ito et al.

(10) Patent No.: US 7,453,343 B2
(45) Date of Patent: Nov. 18, 2008

(54) THIN-FILM TYPE COMMON-MODE CHOKE COIL

(75) Inventors: Tomokazu Ito, Tokyo (JP); Takashi Kudo, Tokyo (JP); Makoto Otomo, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/375,260

(22) Filed: Mar. 15, 2006

(65) Prior Publication Data

US 2006/0176138 A1    Aug. 10, 2006

Related U.S. Application Data

(62) Division of application No. 10/785,029, filed on Feb. 25, 2004, now abandoned.

(30) Foreign Application Priority Data

Feb. 26, 2003  (JP)  .............................. 2003-050016
Feb. 26, 2003  (JP)  .............................. 2003-050124

(51) Int. Cl.
    *H01F 5/00*    (2006.01)
(52) U.S. Cl. ...................................... 336/200
(58) Field of Classification Search .................. 336/65, 336/83, 200, 232, 233
    See application file for complete search history.

(56) References Cited

U.S. PATENT DOCUMENTS 6,600,404 B1 *   7/2003   Kajino ....................... 336/200

2001/0051421 A1 *  12/2001  Watanabe ................... 438/613
2002/0090755 A1 *   7/2002  Matsuzaki et al. ........... 438/108
2003/0076211 A1     4/2003  Matsuta et al.

FOREIGN PATENT DOCUMENTS

| JP | 57052114 A   | * | 3/1982 |
| JP | 57053916 A   | * | 3/1982 |
| JP | 08-138937    |   | 5/1996 |
| JP | 8-203737     |   | 8/1996 |
| JP | 10-144552    |   | 5/1998 |
| JP | 11-54326     |   | 2/1999 |
| JP | 2000-173824  |   | 6/2000 |
| JP | 2002-373810  |   | 12/2002 |

\* cited by examiner

*Primary Examiner*—Tuyen T. Nguyen
(74) *Attorney, Agent, or Firm*—Oblon, Spivak, McClelland, Maier & Neustadt, P.C.

(57) ABSTRACT

A thin-film type common-mode choke coil includes a laminated structure having a magnetic substrate; and electrically insulating layers and conductor layers laminated on the magnetic substrate in a direction of thickness, wherein said conductor layers form at least two coil conductors; at least two of the conductor layers are provided as spiral conductor patterns; and the spiral conductor patterns satisfy the expression: $5\ \mu m \leq W1 \leq 36\ \mu m$ in which W1 is the conductor width of each of the spiral conductor patters. The spiral conductor patterns may also satisfy the expression: $100\ \mu m^2 \leq T*W1$ in which T is the conductor thickness of each of said spiral conductor patterns or satisfy the expression: $W2 < T \times 2$ in which W2 is the space between said spiral conductor patterns, and T is the conductor thickness of each of said spiral conductor patterns.

11 Claims, 7 Drawing Sheets

FIG. 7A
SPUTTERING OF Cr/Cu OR Ti/Cu

FIG. 7D
REMOVING OF RESIST

FIG. 7B
RESIST COATING/EXPOSURE/DEVELOP

FIG. 7E
ETCHING OF UNDERCOAT

FIG. 7C
Cu ELECTROPLATING

FIG. 7F
Ni ELECTROPLATING

FIG. 8

THIN-FILM TYPE COMMON-MODE CHOKE COIL

BACKGROUND OF THE INVENTION

The present application is based upon Japanese application nos. 2003-050016 filed Feb. 26, 2003 and 2003-050124 filed Feb. 26, 2003 and claims priority to U.S. application Ser. No. 10/785,029 filed Feb. 25, 2004, the disclosure of which is herein incorporated by reference.

The present invention relates to a common-mode choke coil, a method for producing the same, and a common-mode choke coil array. Particularly it relates to a filter used for suppressing a common-mode current as a cause of electromagnetic interference becoming an issue in a balanced transmission system, and a method for producing the filter.

A laminated type choke coil is heretofore known as a chip common-mode choke coil. This component has a structure in which a first coil magnetic sheet having a coil conductor pattern formed on a surface of a sheet of magnetic substance such as ferrite to form a first coil and a second coil magnetic sheet formed in the same manner as the first coil magnetic sheet are laminated alternately.

A common-mode choke coil described in Patent Document JP-A-8-203737 is known as a choke coil produced by a thin-film process. This component has a structure in which: a lead-out electrode is formed on a magnetic substrate by a thin-film process; an electrically insulating layer, a first coil conductor, an electrically insulating layer, a second coil conductor and an electrically insulating layer are then formed successively thereon by a thin-film process; and another magnetic substrate is put on an upper surface of the resulting laminate.

Patent Document JP-A-11-54326 has described a common-mode choke coil produced by a thin-film process. In this document, central and outer circumferential portions of each electrically insulating layer produced by the thin-film process are etched (developed) in order to improve the degree of magnetic coupling between coils and increase common impedance. The upper magnetic substrate is bonded by a resin as a mixture of an electrically insulating material and magnetic powder to thereby form a closed magnetic circuit structure.

In the background-art laminated type choke coil, the sheet of magnetic substance is interposed between the first and second coil conductors. When this choke coil is used as a common-mode choke coil, magnetic coupling between two coils is lowered. This becomes a characteristic issue.

In the common-mode choke coil produced by the thin-film process described in Patent Document JP-A-8-203737, the first and second coil conductors are sandwiched between the upper and lower magnetic substrates. Because this structure cannot be provided as a closed magnetic circuit structure, there is a problem in the degree of magnetic coupling and common impedance (it is difficult to improve the degree of magnetic coupling and common impedance).

In the thin-film process described in Patent Document JP-A-11-54326, the aforementioned problem is solved because the closed magnetic circuit structure is formed. The magnetic power-containing resin is however low in adhesive property. There is a problem in adhesion of the magnetic substrate.

As measures to solve this problem, it is possible to bond the magnetic substrate by an adhesive agent after the magnetic powder-containing resin is applied on the magnetic substrate-bonding side of an electrically insulating layer with a built-in coil conductor and cured. The magnetic powder-containing resin is however shrunk when cured. Because the magnetic powder-containing resin embedded in the etching portion (the place where the central and outer circumferential portions of the electrically insulating layer are etched to form a closed magnetic circuit structure) of the electrically insulating layer is shrunk, only the adhesive layer (non-magnetic) as the upper portion of the electrically insulating layer is thickened. Accordingly, it is impossible to obtain a sufficient effect in increasing common impedance.

In the latest balanced transmission line, it is however necessary to perform high-speed transmission of a transmission signal with a frequency of the order of GHz. The thin-film type common-mode choke coil cannot meet such high-speed transmission.

Measures to meet high-speed transmission are suggested as follows.

Firstly, matching of characteristic impedance is suggested. The fact that matching is important is a commonly known fact on a transmission circuit.

Secondly, greater improvement in magnetic coupling is suggested. This improvement is however structurally limited.

Thirdly, reduction in capacitance between conductors is suggested. If the space between the conductors is merely increased in order to reduce such capacitance, increase in size cannot be avoided.

SUMMARY OF THE INVENTION

Upon such circumstances, an object of the invention is to provide a common-mode choke coil, a method for producing the same, and a common-mode choke coil array in which the degree of magnetic coupling substantially equal to that of a closed magnetic circuit and high common impedance can be obtained while adhesion of a magnetic substrate can be improved.

Upon such circumstances, an object of the invention is to provide a micro-size thin-film type common-mode choke coil and a common-mode choke coil array in which high-speed transmission of a transmission signal with a frequency of the order of GHz can be performed.

In order to attain the above-mentioned object, according to the present invention, a common-mode choke coil comprises a first magnetic substrate, electrically insulating layers and coil patterns formed alternately on said first magnetic substrate, and a second magnetic substrate for covering an uppermost one of said electrically insulating layers, wherein central regions of said electrically insulating layers surrounded by said coil patterns and portions of said electrically insulating layers corresponding to outer circumferential regions of said coil patterns are removed; a magnetic powder-containing resin is provided on said uppermost one of said electrically insulating layers and embedded in said removed portions of said electrically insulating layers; and said second magnetic substrate is bonded to a flattened surface of said magnetic powder-containing resin by an adhesive layer.

A method of producing a common-mode choke coil, comprises the steps of: forming electrically insulating layers and coil patterns alternately on a first magnetic substrate (film-forming step); removing central regions of said electrically insulating layers surrounded by said coil patterns and portions of said electrically insulating layers corresponding to outer circumferential regions of said coil patterns (etching step); applying a magnetic power-containing resin onto an uppermost one of said electrically insulating layers and embedding said magnetic power-containing resin in removed portions of said electrically insulating layers (coating step); polishing a surface of said magnetic powder-containing resin after curing said magnetic powder-containing resin to flatten said surface (polishing step); and bonding a second magnetic substrate onto said flattened surface of said magnetic powder-containing resin by an adhesive agent (bonding step).

Furthermore, a thin-film type common-mode choke coil comprises: a laminated structure having a magnetic substrate, and electrically insulating layers and conductor layers laminated on said magnetic substrate in a direction of thickness, wherein: said conductor layers form at least two coil conductors; at least two of said conductor layers are provided as spiral conductor patterns; and said spiral conductor patterns satisfy the expression:

$$5 \,\mu m \leq W1 \leq 36 \,\mu m$$

in which W1 is the conductor width of each of said spiral conductor patterns.

Preferably, the spiral conductor patterns satisfy the expression: W2<T*2 in which W2 is the space between said spiral conductor patterns, and T is the conductor thickness of each of said spiral conductor patterns.

DETAILED DESCRIPTION OF THE PREFERRED EMBODIMENTS

First Embodiment

Embodiments of the invention as to a common-mode choke coil, a method for producing the same and a common-mode choke coil array will be described below with reference to the drawings.

Figure 1:
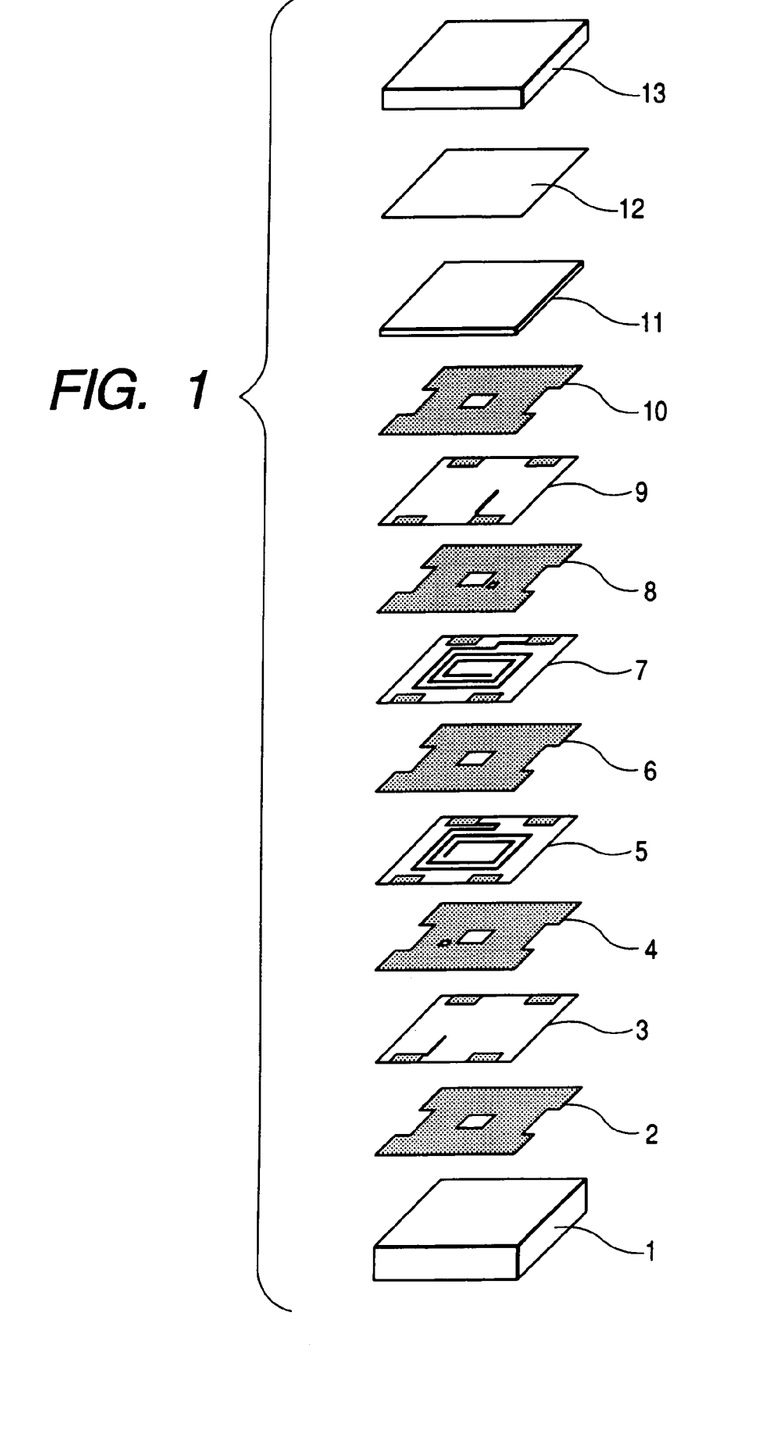
FIG. 1 is an exploded perspective view showing the case where a common-mode choke coil is formed according to an embodiment of the invention.
Figure 2A:
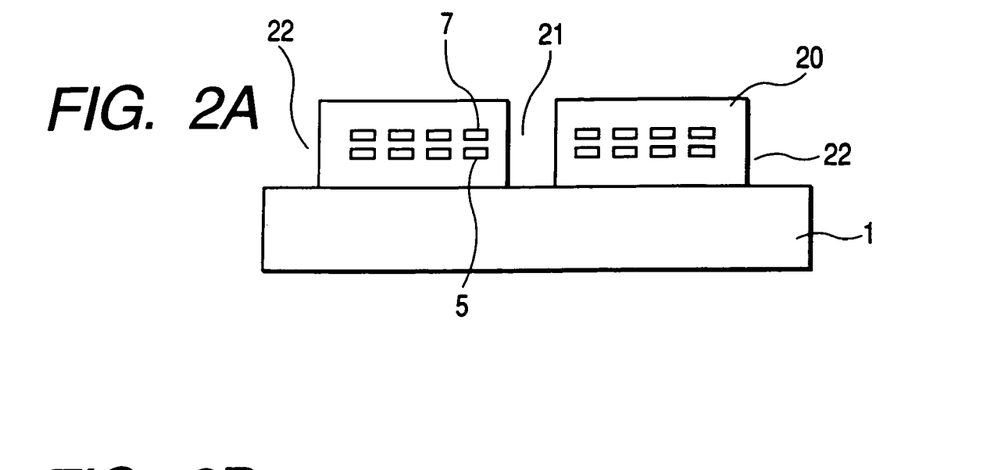
FIG. 2A is an explanatory view showing a process for producing the common-mode choke coil according to the embodiment.
Figure 2B:
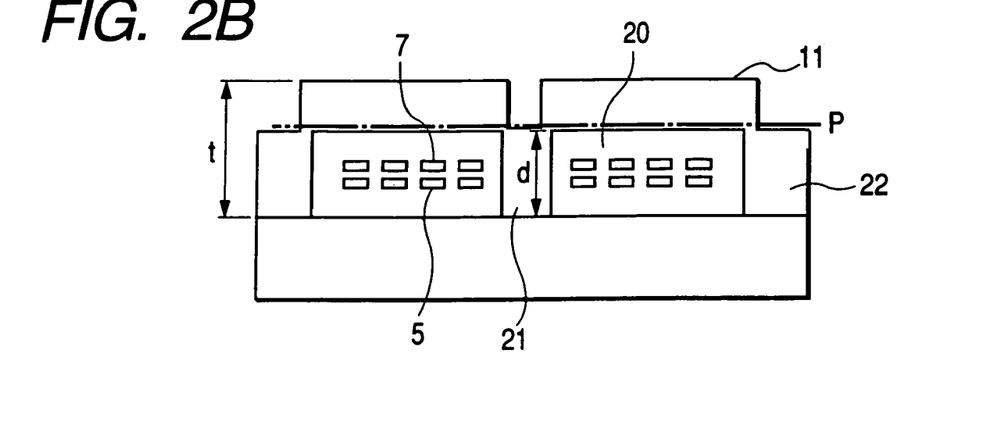
FIG. 2B is an explanatory view showing the process for producing the common-mode choke coil according to the embodiment.
Figure 2C:
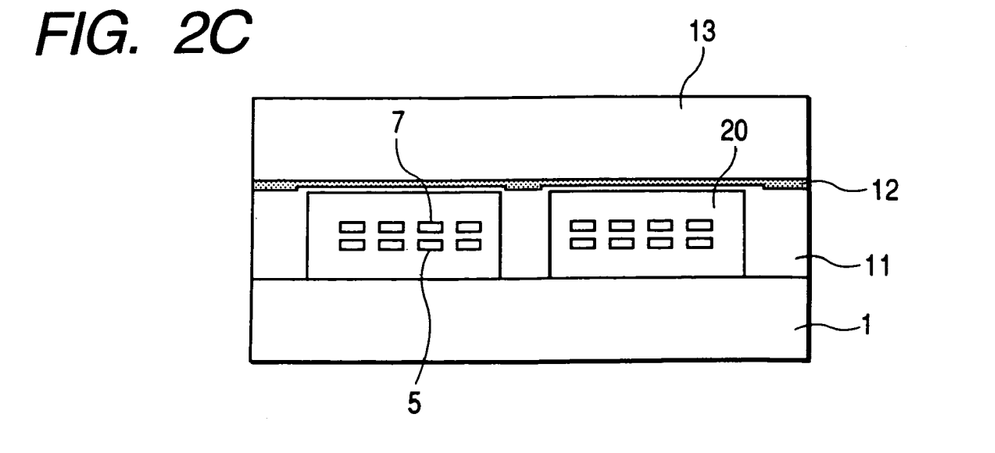
FIG. 2C is an explanatory view showing the process for producing the common-mode choke coil according to the embodiment.

FIG. 1 and FIGS. 2A to 2C show an embodiment of the invention. FIG. 1 is an exploded perspective view showing the case where a chip common-mode choke coil is formed. FIGS. 2A to 2C are explanatory views showing a process for producing the common-mode choke coil. Although a plurality of components are produced simultaneously on a substrate at the time of actual production, this embodiment will be described on the case where a single device is formed.

As shown in FIG. 1 and FIGS. 2A to 2C, the chip common-mode choke coil has: a first magnetic substrate 1; and an electrically insulating layer 2, a first lead-out electrode layer 3, an electrically insulating layer 4, a first coil conductor layer (spiral coil conductor pattern) 5, an electrically insulating layer 6, a second coil conductor layer (spiral coil conductor pattern) 7, an electrically insulating layer 8, a second lead-out electrode layer 9, an electrically insulating layer 10, a magnetic layer 11, an adhesive layer 12 and a second magnetic substrate 13 laminated successively on a principal surface of the first magnetic substrate 1 so as to be integrated into one body.

On this occasion, the first lead-out electrode layer 3 and the first coil conductor layer 5 are electrically connected to each other through a through-hole whereas the second lead-out electrode layer 9 and the second coil conductor layer 7 are electrically connected to each other through a through-hole. One end of each lead-out electrode layer and one end of each coil conductor layer are connected to external electrodes (formed on an outer circumferential surface of the chip) respectively.

The magnetic layer 11 is formed in such a manner that a magnetic powder-containing resin is applied and cured. After cured, the magnetic powder-containing resin is polished to reduce surface roughness. The second magnetic substrate 13 is integrally bonded to the flattened surface of the magnetic layer 11 through the adhesive layer 12.

Each of the magnetic substrates 1 and 13 is made of a material such as sintered ferrite or composite ferrite in that resin is mixed therein. Each of the electrically insulating layers 2, 4, 6, 8 and 10 is made of a material excellent in electrically insulating property and good in processability, such as a polyimide resin or an epoxy resin. The magnetic powder-containing resin used for forming the magnetic layer 11 is a mixture of a resin such as an epoxy resin and magnetic powder such as ferrite powder.

The chip common-mode choke coil is produced by the following procedure. Incidentally, the procedure is based on the case where the lead-out electrode layers 3 and 9 and the first and second coil conductor layers 5 and 7 as spiral coil conductor patterns are formed by a vacuum film-forming method (such as vapor deposition or sputtering) or a plating method.

The electrically insulating layer 2 made of an electrically insulating resin is formed on the magnetic substrate 1. A spin coating method, a dip coating method, a spray coating method or a printing method is used as the method for forming the electrically insulating layer 2. Then, the electrically insulating layer 2 is etched (developed) to remove a central region which will be surrounded by a spiral coil conductor pattern and outer circumferential regions which will become the outside of the spiral coil conductor pattern.

A film of a metal is formed on the electrically insulating layer 2 by a vacuum film-forming method or a plating method. It is preferable from the point of view of electrical conductivity and processability that Cu, Al or the like is used as the metal. Then, a pattern is formed to thereby form the lead-out electrode layer 3. The patterning is performed by a method such as an etching method using photolithography or an additive method (plating) using photolithography.

Then, the electrically insulating layer 4 made of an electrically insulating resin is formed in the same manner as the electrically insulating layer 2. On this occasion, a contact hole for connecting the lead-out electrode layer 3 and the coil conductor layer 5 to each other are formed while regions corresponding to central and outer circumferential portions of the coil conductor pattern (which will be formed) are etched.

Then, the first coil conductor layer 5 as a spiral coil conductor pattern is formed. The method for forming the first coil conductor layer 5 is the same as the method for forming the lead-out electrode layer 3.

Then, the electrically insulating layer 6 made of an electrically insulating resin is formed. The method for forming the electrically insulating layer 6 is the same as the method for forming the electrically insulating layer 2.

Then, the second coil conductor layer 7 as a spiral coil conductor pattern, the electrically insulating layer 8 (electrically insulating resin), the lead-out electrode layer 9 and the electrically insulating layer 10 (electrically insulating resin) are formed successively in the same manner as described above.

When the film-forming process for forming electrically insulating layers each made of an electrically insulating resin and conductor layers containing spiral coil conductor patterns alternately on the first magnetic substrate 1 and the etching process for removing the central regions of the respective electrically insulating layers surrounded by the coil conductor patterns and the outer circumferential regions of the respective electrically insulating layers corresponding to the outside of the coil conductor patterns are performed as described above, a laminate 20 including coil conductor patterns on the first magnetic substrate 1 is obtained as shown in FIG. 2A. A resin removal portion 21 (recess) and resin removal portions 22 (cut portions) in which the electrically insulating layers are removed are formed in the central and outer circumferential regions of the laminate 20.

Then, a magnetic powder-containing resin (which serves as a magnetic layer when cured) 11 is printed on the upper surface of the electrically insulating layer 10 (the upper surface of the laminate 20 in FIGS. 2A to 2C) by a coating process shown in FIG. 2B. Then, the magnetic powder-containing resin 11 is cured. At the time of printing, the magnetic powder-containing resin 11 is applied so as to be embedded in the resin removal portions 21 and 22. At the time of curing, the resin 11 is however shrunk, so that the surface of the magnetic powder-containing resin 11 is roughened (dented in places of the resin removal portions 21 and 22). To reduce surface roughness as sufficiently as possible, it is preferable that the thickness t of the magnetic powder-containing resin 11 provided by the coating process is set to be not smaller than 1.5 times as large as the depth d of the resin removal portions 21 and 22.

Then, the upper surface of the magnetic powder-containing resin 11 is polished up to the height of the chain line P as shown in FIG. 2B to thereby perform a flattening process (to reduce surface roughness).

Then, in a bonding process shown in FIG. 2C, an adhesive agent is applied on the magnetic layer 11 which is formed by polishing and flattening the whole upper surface of the magnetic powder-containing resin after curing. The second magnetic substrate 13 is bonded to the magnetic layer 11 through the adhesive layer 12 provided in this manner.

Although description has been made on the case where one device is formed, a plurality of devices are produced simultaneously on a substrate in actual production. The product on the substrate is cut into one-device chips. Then, external electrodes are formed on an outer surface of each chip. In this manner, each common-mode choke coil is completed.

According to this embodiment, the following effects can be obtained.

The second magnetic substrate 13 can be bonded surely, so that structural reliability can be ensured. In addition, because the second magnetic substrate 13 is bonded after surface roughness of the magnetic layer 11 made of the magnetic powder-containing resin cured is flattened, the degree of magnetic coupling substantially equal to that of a closed magnetic circuit and high common impedance can be obtained.

Because the thickness t of the magnetic powder-containing resin provided by the coating process is set to be not smaller than 1.5 times as large as the depth d of the resin removal portions 21 and 22, surface roughness of the magnetic layer 11 made of the magnetic powder-containing resin cured can be reduced so that the quantity of polishing in the flattening process can be reduced.

Figure 3:
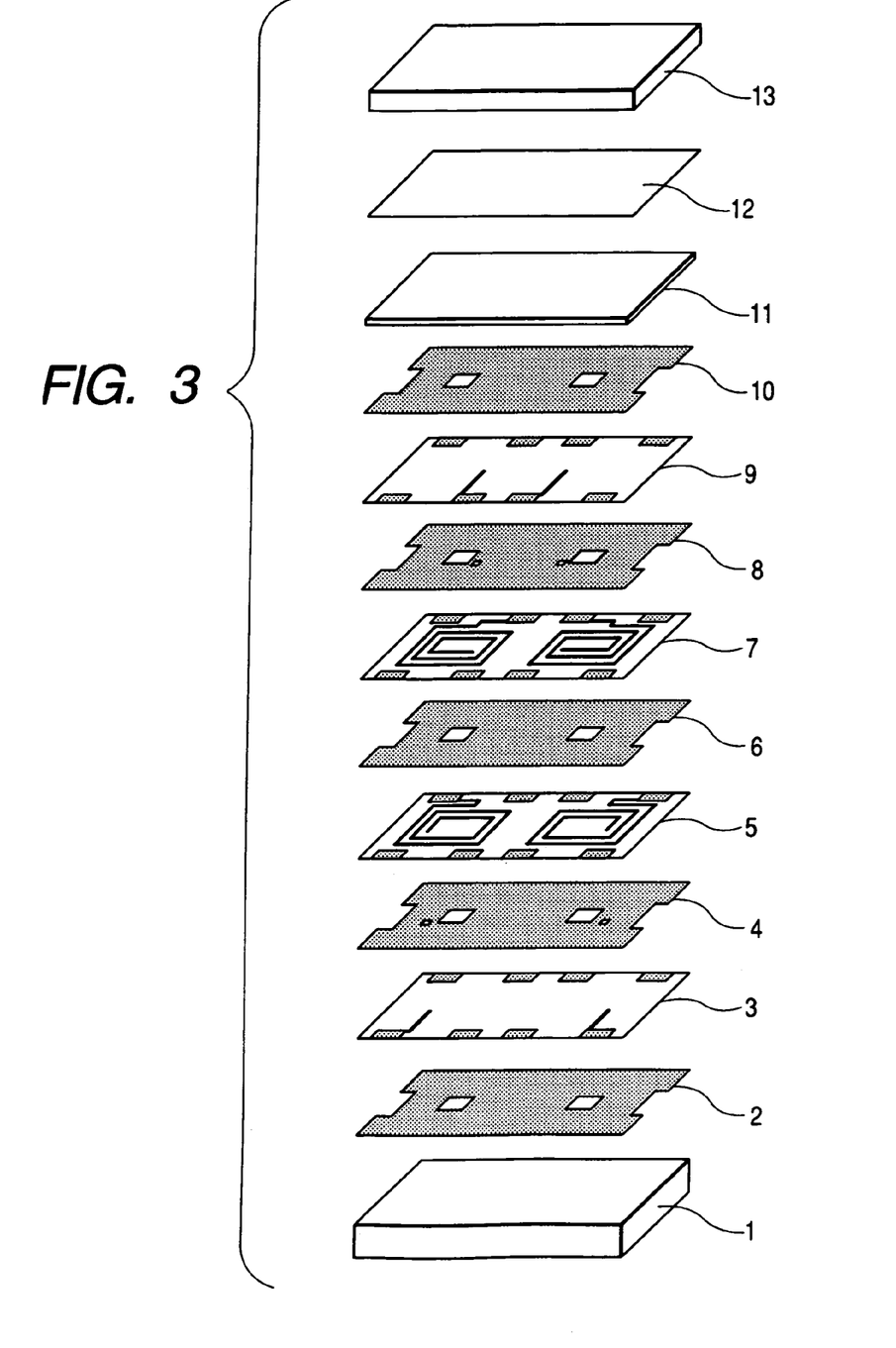
FIG. 3 is an exploded perspective view showing the case where a common-mode choke coil array is formed according to another embodiment of the invention.

FIG. 3 shows the case where a common-mode choke coil array is produced according to another embodiment of the invention. In this case, two common-mode choke coils each equivalent to the common-mode choke coil according to the previous embodiment are arranged on a first magnetic substrate 1 to thereby form the array. Parts equal or equivalent to parts in the previous embodiment are referred to by identical numerals for the sake of omission of duplicated description.

Although the embodiments of the invention have been described above, the invention is not limited thereto and it is self-evident to those skilled in the art that various changes or modifications may be made without departing from the scope of Claim.

As described above, in accordance with the invention, there can be achieved a common-mode choke coil and a common-mode choke coil array in which the degree of magnetic coupling substantially equal to that of a closed magnetic circuit and high common impedance can be obtained while adhesion of the magnetic substrate can be improved.

Second Embodiment

Embodiments of the invention as to a thin-film type common-mode choke coil and a common-mode choke coil array will be described below with reference to the drawings.

Figure 4:
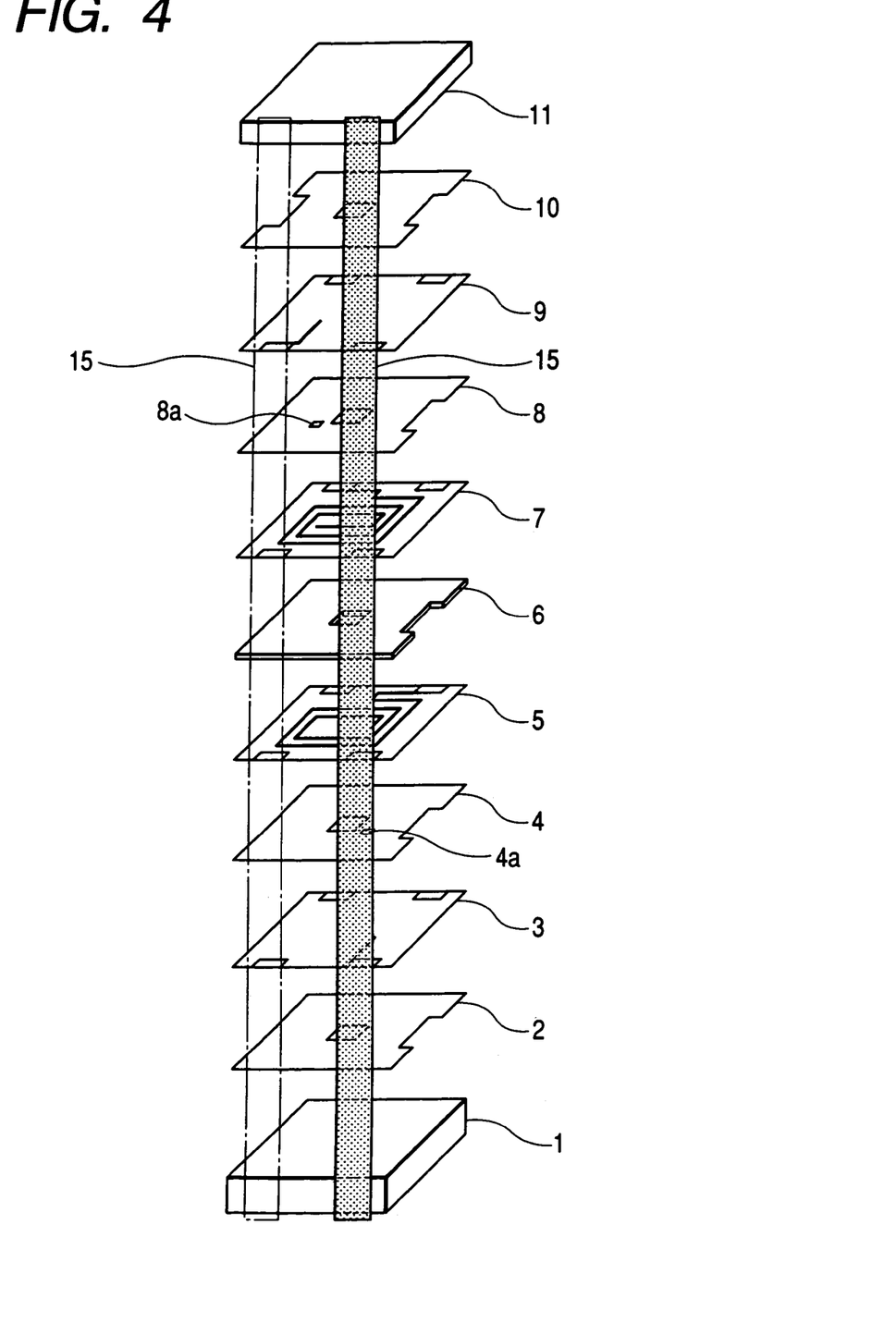
FIG. 4 is an exploded perspective view showing the case where a thin-film type common-mode choke coil is formed according to an embodiment of the invention.
Figure 5:
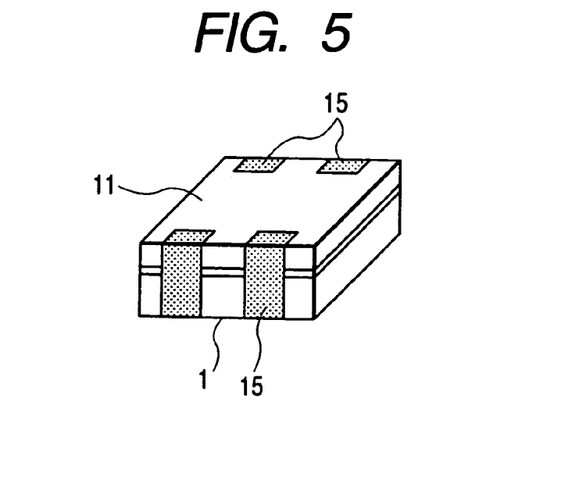
FIG. 5 is a perspective view showing the external appearance of the thin-film type common-mode choke coil according to the embodiment.

FIGS. 4 and 5 show second embodiment of the invention. FIG. 3 is an exploded perspective view showing the case where a thin-film type common-mode choke coil is formed. FIG. 5 is a perspective view showing the external appearance of the common-mode choke coil. Although a plurality of components are produced simultaneously on a substrate at the time of actual production, this embodiment will be described on the case where a single device is formed.

As shown in FIGS. 4 and 5, the thin-film type common-mode choke coil shaped like a chip in terms of external form has: a first magnetic substrate 1; and an electrically insulating layer 2, a first lead-out electrode layer 3, an electrically insulating layer 4, a first coil conductor layer (spiral coil conductor pattern) 5, an electrically insulating layer 6, a second coil conductor layer (spiral coil conductor pattern) 7, an electrically insulating layer 8, a second lead-out electrode layer 9, an electrically insulating layer 10 and a second magnetic substrate 11 laminated successively on a principal surface of the first magnetic substrate 1 so as to be integrated into one body. The first coil conductor layer 5 and the second coil conductor layer 7 are arranged so as to be magnetically coupled with each other. When differential-mode currents flow in the two conductor layers 5 and 7, two kinds of magnetic flux in the two conductor layers 5 and 7 cancel each other. When common-mode currents flow in the two conductor layers 5 and 7, two kinds of magnetic flux in the two conductor layers 5 and 7 are added up.

On this occasion, the first lead-out electrode layer 3 and the first coil conductor layer 5 are electrically connected to each other through a through-hole 4a whereas the second lead-out electrode layer 9 and the second coil conductor layer 7 are electrically connected to each other through a through-hole 8a. One end of each lead-out electrode layer and one end of each coil conductor layer are connected to external electrodes 15 (formed on an outer circumferential surface of the chip as shown in FIG. 5) respectively.

Each of the magnetic substrates 1 and 11 is made of a material such as sintered ferrite or composite ferrite in that resin is mixed therein. Each of the electrically insulating layers 2, 4, 6, 8 and 10 is made of a material excellent in electrically insulating property and good in processability, such as a polyimide resin or an epoxy resin.

Figure 6:
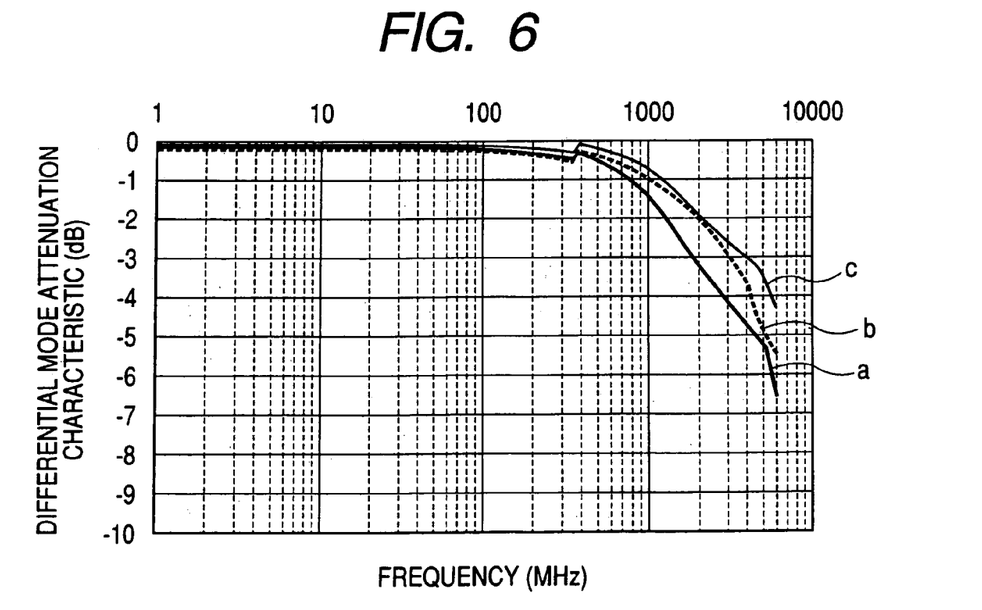
FIG. 6 is a graph showing differential-mode attenuation characteristic of the common-mode choke coil.

The relation between the conductor width of the first and second coil conductor layers 5 and 7 as spiral coil conductor patterns and the attenuation characteristic of a transmission signal is as shown in FIG. 6. In FIG. 6, the curve a shows frequency characteristic of differential-mode attenuation characteristic (dB) in the case where the conductor width, the conductor thickness and the space between the two conductors are 45 µm, 18 µm and 20 µm respectively, the curve b shows frequency characteristic of differential-mode attenuation characteristic (dB) in the case where the conductor width, the conductor thickness and the space between the two conductors are 36 µm, 18 µm and 13 µm respectively, and the curve c shows frequency characteristic of differential-mode attenuation characteristic (dB) in the case where the conductor width, the conductor thickness and the space between the two conductors are 12 µm, 18 µm and 12 µm respectively. The data transmission attenuation characteristic is improved as the width of the spiral conductors decreases. It is obvious from FIG. 6 that reducing the conductor width to a value not larger than 36 µm is effective in increasing the cutoff frequency (attenuation −3 dB) of the transmission signal to a value not lower than 2.4 GHz (800 MHz transmission×3). On the other hand, in view of stability of plating of the fine conductor pattern and the resolution of the resist layer, the conductor width should be larger than 5 µm. It can be therefore said that high-speed transmission is obtained effectively when the conductor width W1 of the first and second conductor layers 5 and 7 satisfies the following expression.

$$5 \ \mu m \leq W1 \leq 36 \ \mu m$$

Reduction in conductor width on this occasion causes increase in DC resistance. It is therefore necessary to increase the conductor thickness in order to suppress the reduction in conductor width. As mentioned above, the conductor width W1 is necessitated to set within the range 5 µm≦W1≦36 µm. Thickness T of the conductor is necessitated to satisfy the expression T≦5*W1 in view of the fabrication limitation. Further, in order to prevent the DC resistance from excessively increasing, across section T*W1 is set to be larger than 100 µm². (100 µm²≦T*W1)

In case the conductor thickness increases, side etching twice as large as the conductor thickness T is produced when a vacuum film-forming/etching process is used. It is actually difficult to thicken the conductors because the space between the conductors is not smaller than T×2 when the conductor thickness is increased. (It is necessary to increase the spiral area because the space between the conductors is widened).

This problem can be solved when the spiral coil conductor layers 5 and 7 are formed by an electroplating method (additive method). The relation between the thickness of the spiral conductors and the space between the conductors can be set as follows. The thick spiral coil conductor layers 5 and 7 can be formed in a small space.

$$W2<T\times 2$$

The procedure for forming the spiral coil conductor layers 5 and 7 satisfying the aforementioned condition by a plating method is as follows.

Figure 7A:
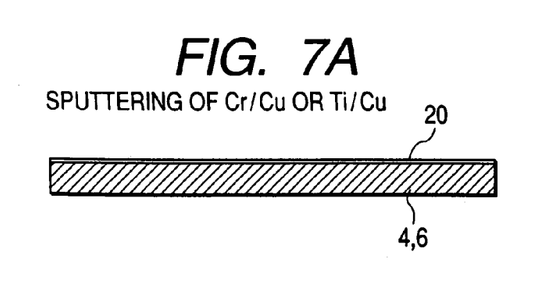
FIG. 7A is an explanatory view showing a process for producing a spiral conductor pattern in the embodiment.

As shown in FIG. 7A, an undercoat conductor film 20 is formed on each of the electrically insulating layers 4 and 6 by a vacuum film-forming method (such as sputtering). This undercoat conductor film 20 has a two-layered structure, which is manufactured by continuous sputtering. On this occasion, the undercoat conductor film 20 is preferably made of Cr/Cu (a combination of a lower layer of Cr and an upper layer of Cu) or Ti/Cu if consideration is given to adhesion to the resin of each of the electrically insulating layers 4 and 6 and electroplating which will be made. The lower Cu or Ti layer contributes toward adhesion to the resin and the upper Cu layer contributes toward adhesion to the electroplating layer.

A photo resist 21 is applied on the undercoat conductor film 20. On this occasion, the photo resist 21 applied is preferably thicker than the spiral conductor which will be formed by electroplating.

Figure 7B:
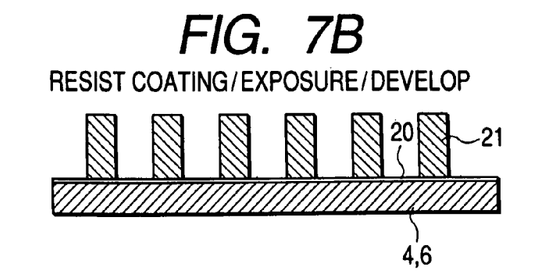
FIG. 7B is an explanatory view showing the process for producing the spiral conductor pattern in the embodiment.

Then, the resist 21 is exposed to light while a photo mask having a pattern necessary for obtaining the spiral conductor pattern is used. The resist 21 is developed. In this manner, a resist pattern shown in FIG. 7B is formed. That is, the undercoat conductor film 20 is revealed in accordance with the spiral shape.

Figure 7C:
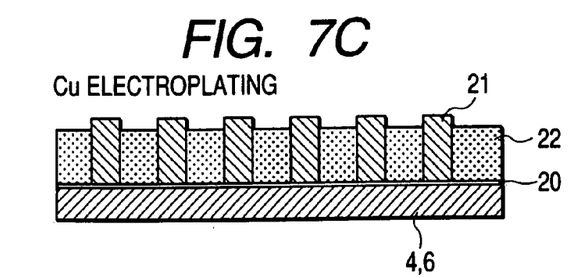
FIG. 7C is an explanatory view showing the process for producing the spiral conductor pattern in the embodiment.

Then, as shown in FIG. 7C, while the undercoat conductor film 20 which has been already formed is used as an electrode, a thickening conductor 22 is formed by electroplating. On this occasion, the pattern of the resist 21 serves as a dam, so that electroplating is performed spirally.

Figure 7D:
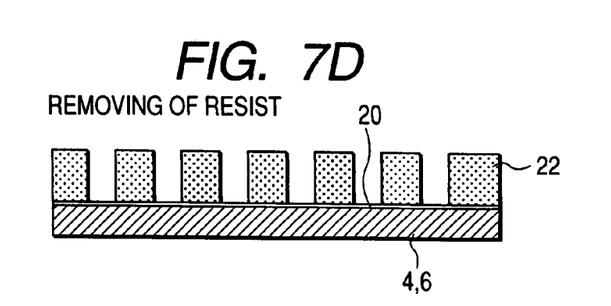
FIG. 7D is an explanatory view showing the process for producing the spiral conductor pattern in the embodiment.
Figure 7E:
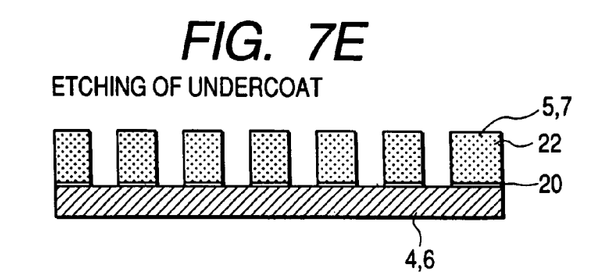
FIG. 7E is an explanatory view showing the process for producing the spiral conductor pattern in the embodiment.

Then, as shown in FIG. 7D, the resist becoming unnecessary after electroplating is peeled. Further, as shown in FIG. 7E, the undercoat conductor film 20 except the thickening conductor 22 formed in the spiral plating portion is removed by etching. In this manner, the spiral coil conductor layers 5 and 7 are completed.

The electroplating metal used in the thickening conductor is preferably Cu if consideration is given to plating characteristic, cost, electrical conductivity, etc.

Figure 7F:
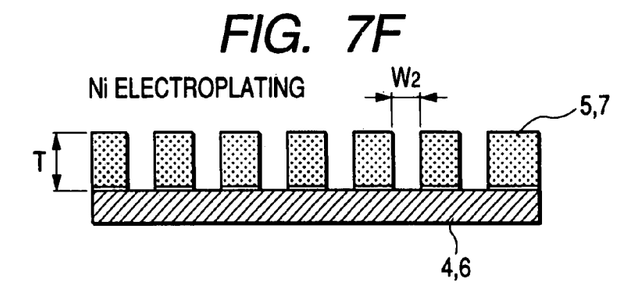
FIG. 7F is an explanatory view showing the process for producing the spiral conductor pattern in the embodiment.

It is effective that the thickening conductor 22 of Cu formed by electroplating is further plated with Ni as shown in FIG. 7F if consideration is given to corrosion resistance and adhesion of a resin which will be applied on the thickening conductor 22.

The procedure for producing the thin-film type common-mode choke coil will be described below with reference to FIG. 4. The electrically insulating layer 2 is formed on the first magnetic substrate 1. A spin coating method, a dip coating method, a spray coating method or a printing method is used as the method for forming the electrically insulating layer 2.

Then, a film of a conductor is formed on the electrically insulating layer 2 so that the first lead-out electrode layer 3 is formed by photolithography. Sputtering, vapor deposition, plating or the like is used as the method for forming the conductor film. In the photolithography, a photo resist is used. After exposure and development, an unnecessary metal portion is etched and then the resist is peeled.

Then, the electrically insulating layer 4 is formed. Although the electrically insulating layer 4 is formed in the same manner as the electrically insulating layer 2, photolithography is used for forming a through-hole 4a by development so that the lead-out electrode layer 3 and the spirally shaped first coil conductor layer 5 can be connected to each other. The lead-out electrode layer 3 and the first coil conductor layer 5 are electrically connected to each other by the through-hole 4a.

Then, the spirally shaped first coil conductor layer 5 is formed and patterned by an electroplating method (additive method) as shown in FIGS. 7A to 7F.

Then, the electrically insulating layer 6 is formed in the same manner as the electrically insulating layer 2. The spirally shaped second coil conductor layer 7 is formed and patterned on the electrically insulating layer 6 in the same manner as the first coil conductor layer 5.

Then, the electrically insulating layer 8 is formed in the same manner as the electrically insulating layer 4. Photolithography is used for forming a through-hole 8a by development so that the second lead-out electrode layer 9 and the spirally shaped second coil conductor layer 7 can be connected to each other.

Then, the second lead-out electrode layer 9 is formed in the same manner as the first lead-out electrode layer 3.

Then, the electrically insulating layer 10 is formed in the same manner as the electrically insulating layer 2. The second magnetic substrate 11 is bonded onto the electrically insulating layer 10.

Although description has been made on the case where one device is formed, a plurality of devices are produced simultaneously on a substrate in actual production. After the product on the substrate is cut into one-device chips, external electrodes 15 are formed as shown in FIG. 5. In this manner, each common-mode choke coil is completed.

According to this embodiment, the following effects can be obtained.

The conductor width (W1) of the first and second coil conductor layers 5 and 7 as two spiral conductor patterns satisfies the following expression.

$$5 \: \mu m \leq W1 \leq 36 \: \mu m$$

As is obvious from FIG. 6, the cutoff frequency of a transmission signal can be selected to be not lower than 2.4 GHz. The common-mode choke coil can meet high-speed transmission.

When the thickening conductor 22 is formed on the undercoat conductor film 20 by an electroplating method (additive method) shown in FIGS. 7A to 7F, the relation between the conductor thickness (T) of the spiral coil conductor layers 5 and 7 and the space (W2) between the conductors can be selected to satisfy the following expression.

$$W2 < T \times 2$$

The space between the conductors can be reduced to attain reduction in size (area) of the spiral shape.

Because the undercoat conductor film 20 is made of a combination of a lower layer of Cr and an upper layer of Cu or a combination of a lower layer of Ti and an upper layer of Cu, adhesion to the resin of each electrically insulating layer can be made good to be adapted to electroplating of the thickening conductor 22 of Cu.

When each of the spiral coil conductor layers 5 and 7 is plated with Ni, corrosion resistance and adhesion to the electrically insulating layer of the resin applied on the spiral coil conductor layer can be improved.

Figure 8:
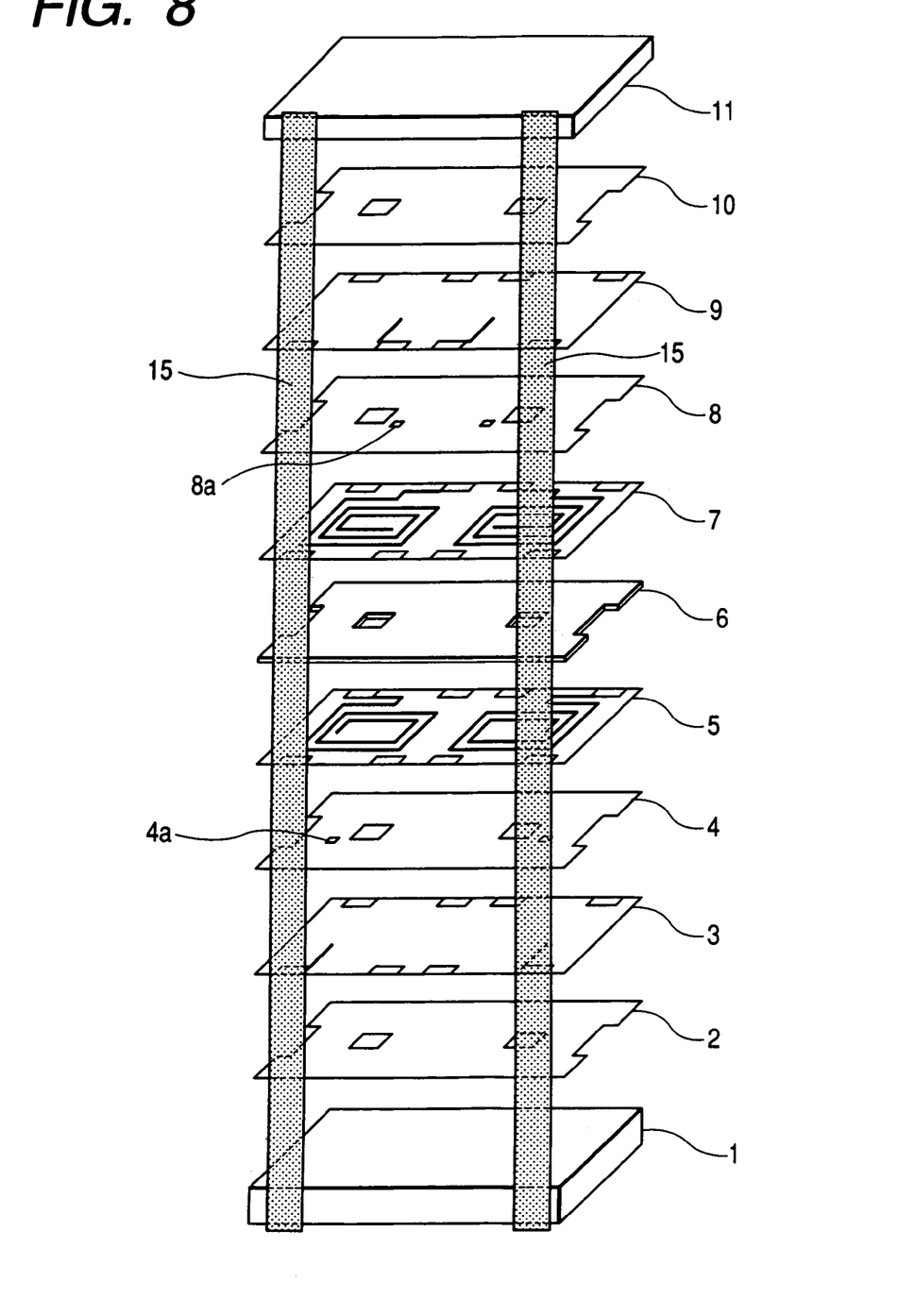
FIG. 8 is an exploded perspective view showing the case where a thin-film type common-mode choke coil array is formed according to another embodiment of the invention.

FIG. 8 shows the case where a thin-film type common-mode choke coil array is produced according to another embodiment of the invention. In this case, two common-mode choke coils each equivalent to the common-mode choke coil according to the previous embodiment are arranged on a first magnetic substrate 1 to thereby form the array. In this configuration, a 2010 type (2 mm long by 1 mm wide by 1 mm thick) common-mode choke coil array can be achieved. Incidentally, parts equal or equivalent to parts in the previous embodiment are referred to by identical numerals for the sake of omission of duplicated description.

In each embodiment, the technique of bonding the second magnetic substrate may be replaced by a technique of providing a magnetic material such as a magnetic powder-containing resin by a coating method or the like to cover the common-mode choke coil with the magnetic material.

Although the embodiments of the invention have been described above, the invention is not limited thereto and it is self-evident to those skilled in the art that various changes or modifications may be made without departing from the scope of Claim.

As described above, in accordance with the invention, there can be achieved a micro-size thin-film type common-mode choke coil and a common-mode choke coil array in which a transmission signal with a frequency of the order of GHz can be transmitted at a high speed.

What is claimed is:

1. A thin-film type common-mode choke coil, comprising:
a laminated structure having a magnetic substrate; and
electrically insulating layers and conductor layers laminated on said magnetic substrate in a direction of thickness,
wherein said conductor layers form at least two coil conductors;
at least two of said conductor layers are provided as spiral conductor patterns that are magnetically coupled to each other, respective kinds of magnetic flux in said spiral conductor patterns cancel each other when differential-mode currents flow in said spiral conductor patterns, and the respective kinds of magnetic flux in said spiral conductor patterns are added up when common-mode currents flow in said spiral conductor patterns;
said spiral conductor patterns satisfy the expression $$5 \: \mu m \leq W1 \leq 36 \: \mu m$$

in which W1 is the conductor width of each of said spiral conductor patterns; and
said spiral conductor patterns satisfy the expression $$W2 < T \times 2$$

in which W2 is the space between said spiral conductor patterns, and T is the conductor thickness of each of said spiral conductor patterns.

2. The thin-film type common-mode choke coil according to claim 1, wherein said spiral conductor patterns satisfy the expression $$100 \: \mu m^2 \leq T * W1$$

in which T is the conductor thickness of each of said spiral conductor patterns.

3. The thin-film type common-mode choke coil according to claim 1, wherein each of said spiral conductor patterns is composed of an undercoat conductor formed as a thin film, and a thickened conductor formed on said undercoat conductor and provided as a Cu-plating layer.

4. The thin-film type common-mode choke coil according to claim 3, wherein said undercoat conductor is made of a combination of a lower layer of Cr and an upper layer of Cu or a combination of a lower layer of Ti and an upper layer of Cu.

5. The thin-film type common-mode choke coil according to claim 3, wherein a surface of each of said spiral conductor patterns is covered with an Ni-plating film.

6. The thin-film type common-mode choke coil according to claim 1, wherein an upper surface of said laminated structure is covered with a magnetic material.

7. The thin-film type common-mode choke coil according to claim 1, wherein another magnetic substrate is bonded to an upper surface of said laminated structure.

8. A thin-film type common-mode choke coil array comprising a plurality of thin-film type common-mode choke coils, each comprising:
   a laminated structure having a magnetic substrate; and
   electrically insulating layers and conductor layers laminated on said magnetic substrate in a direction of thickness,
   wherein said conductor layers form at least two coil conductors;
   at least two of said conductor layers are provided as spiral conductor patterns that are magnetically coupled to each other, respective kinds of magnetic flux in said spiral conductor patterns cancel each other when differential-mode currents flow in said spiral conductor patterns, and the respective kinds of magnetic flux in said spiral conductor patterns are added up when common-mode currents flow in said spiral conductor patterns;
   said spiral conductor patterns satisfy the expression $$5 \text{ μm} \leq W1 \leq 36 \text{ μm}$$

in which W1 is the conductor width of each of said spiral conductor patterns; and
   said spiral conductor patterns satisfy the expression $$W2 < T \times 2$$

in which W2 is the space between said spiral conductor patterns, and T is the conductor thickness of each of said spiral conductor patterns.

9. The thin-film type common-mode choke coil according to claim 1, further comprising:
   a first lead-out electrode layer;
   a second lead-out electrode layer; and
   another magnetic substrate,
   wherein the conductor layers include a first coil conductor layer and a second coil conductor layer,
   the electrically insulating layers include a first insulating layer, a second insulating layer, a third insulating layer, a fourth insulating layer, and a fifth insulating layer, and
   the first insulating layer, the first lead-out electrode layer, the second insulating layer, the first coil conductor layer, the third insulating layer, the second coil conductor layer, the fourth insulating layer, the second lead-out electrode layer, the fifth insulating layer, and the another magnetic substrate are laminated successively on a principal surface of the magnetic substrate, so as to be integrated into a single body.

10. The thin-film type common-mode choke coil array according to claim 8, wherein each of said spiral conductor patterns is composed of an undercoat conductor formed as a thin film, and a thickened conductor of Cu formed on said undercoat conductor, and
    the undercoat conductor is made of a combination of a lower layer of Cr and an upper layer of Cu, or a combination of a lower layer of Ti and an upper layer of Cu.

11. The thin-film type common-mode choke coil array according to claim 8, further comprising:
    a first lead-out electrode layer;
    a second lead-out electrode layer; and
    another magnetic substrate,
    wherein the conductor layers include a first coil conductor layer and a second coil conductor layer,
    the electrically insulating layers include a first insulating layer, a second insulating layer, a third insulating layer, a fourth insulating layer, and a fifth insulating layer, and
    the first insulating layer, the first lead-out electrode layer, the second insulating layer, the first coil conductor layer, the third insulating layer, the second coil conductor layer, the fourth insulating layer, the second lead-out electrode layer, the fifth insulating layer, and the another magnetic substrate are laminated successively on a principal surface of the magnetic substrate, so as to be integrated into a single body.

* * * * *